(12) United States Patent
Harvey et al.

(10) Patent No.: US 11,521,445 B2
(45) Date of Patent: Dec. 6, 2022

(54) INTEGRATED ELECTRONIC ENTRY DOOR SYSTEMS

(71) Applicant: Therma-Tru Corporation, Maumee, OH (US)

(72) Inventors: Logan Harvey, Maumee, OH (US); Bert Spellman, Maumee, OH (US); Michael Stagg, Maumee, OH (US); Garett Strandemo, Maumee, OH (US)

(73) Assignee: THERMA-TRU CORPORATION, Maumee, OH (US)

( * ) Notice: Subject to any disclaimer, the term of this patent is extended or adjusted under 35 U.S.C. 154(b) by 534 days.

(21) Appl. No.: 16/530,957

(22) Filed: Aug. 2, 2019

(65) Prior Publication Data

US 2020/0040649 A1 Feb. 6, 2020

Related U.S. Application Data

(60) Provisional application No. 62/714,273, filed on Aug. 3, 2018.

(51) Int. Cl.
*E06B 7/28* (2006.01)
*H05K 7/02* (2006.01)
(Continued)

(52) U.S. Cl.
CPC .......... *G07C 9/00944* (2013.01); *E05B 47/00* (2013.01); *E05D 11/0081* (2013.01);
(Continued)

(58) Field of Classification Search
CPC ............. E05B 2047/0059; E05B 47/00; E05D 11/0081; E06B 2009/2417; E06B 2009/2464; E06B 7/28; E06B 9/24; F21V 33/006; G07C 2009/00769; G07C 2009/00793; G07C 9/00309;
(Continued)

(56) References Cited

U.S. PATENT DOCUMENTS 3,793,500 A * 2/1974 Gerber .................. E05B 49/004
200/43.08
4,332,429 A * 6/1982 Frick ..................... F25D 23/065
29/432.1

(Continued)

OTHER PUBLICATIONS

U.S. Office Action on U.S. Appl. No. 17/072,950 dated Aug. 18, 2021.

(Continued)

*Primary Examiner* — Yong Hang Jiang
(74) *Attorney, Agent, or Firm* — Foley & Lardner LLP

(57) ABSTRACT

A door assembly includes a door slab, an electronic component embedded in the door slab, and electric wiring connected to the electronic component. The door slab includes a frame defining a cavity, a core disposed within the cavity, a front door skin disposed along a front side of the frame, and a rear door skin disposed along a rear side of the frame. The front door skin and the rear door skin enclose the core within the cavity. The frame has a hinged edge configured to be pivotally coupled to a door jamb. The electric wiring is connected to the electronic component and routed through the door slab to the hinged edge to facilitate electrically coupling the electronic component to an external power source.

15 Claims, 7 Drawing Sheets

(51) Int. Cl.
*F21V 33/00* (2006.01)
*E06B 9/24* (2006.01)
*E05D 11/00* (2006.01)
*E05B 47/00* (2006.01)
*H04N 5/225* (2006.01)
*H04N 7/18* (2006.01)
*G07C 9/00* (2020.01)
*H04B 1/04* (2006.01)
*H04W 4/80* (2018.01)
*H02G 11/00* (2006.01)

(52) U.S. Cl.
CPC .............. *E06B 7/28* (2013.01); *E06B 9/24* (2013.01); *F21V 33/006* (2013.01); *G07C 9/00309* (2013.01); *G07C 9/00571* (2013.01); *H04B 1/04* (2013.01); *H04N 5/2253* (2013.01); *H04N 7/183* (2013.01); *H04N 7/186* (2013.01); *H04W 4/80* (2018.02); *H05K 7/02* (2013.01); *E06B 2009/2417* (2013.01); *E06B 2009/2464* (2013.01); *G07C 2009/00769* (2013.01); *H02G 11/00* (2013.01)

(58) Field of Classification Search
CPC ............ G07C 9/00571; G07C 9/00904; G07C 9/00944; H02G 11/00; H04B 1/04; H04N 5/2253; H04N 5/2257; H04N 7/183; H04N 7/186; H04W 4/80; H05K 7/02
See application file for complete search history.

(56) References Cited

U.S. PATENT DOCUMENTS

| | | | |
|---|---|---|---|
| 5,398,175 A | 3/1995 | Pea | |
| 5,586,895 A * | 12/1996 | Zehrung | E05D 11/0081 16/223 |
| 6,049,287 A * | 4/2000 | Yulkowski | A62C 2/24 292/251.5 |
| 6,064,316 A | 5/2000 | Glick et al. | |
| 9,644,399 B2 | 5/2017 | Johnson et al. | |
| 9,683,391 B2 | 6/2017 | Johnson et al. | |
| 9,685,015 B2 | 6/2017 | Johnson | |
| 9,685,017 B2 | 6/2017 | Johnson | |
| 9,691,198 B2 | 6/2017 | Cheng et al. | |
| 9,704,320 B2 | 7/2017 | Johnson et al. | |
| 9,727,328 B2 | 8/2017 | Johnson | |
| 9,761,073 B2 | 9/2017 | Yu et al. | |
| 9,761,074 B2 | 9/2017 | Cheng et al. | |
| 9,767,632 B2 | 9/2017 | Johnson | |
| 9,916,746 B2 | 3/2018 | Johnson et al. | |
| 10,017,963 B2 | 7/2018 | Johnson et al. | |
| 10,304,273 B2 | 5/2019 | Johnson et al. | |
| 10,361,880 B1 * | 7/2019 | Marcinkowski | G08B 13/196 |
| 10,388,094 B2 | 8/2019 | Johnson | |
| 10,443,266 B2 | 10/2019 | Johnson et al. | |
| 10,445,999 B2 | 10/2019 | Johnson et al. | |
| 10,616,721 B2 | 4/2020 | Theurer et al. | |
| 10,691,953 B2 | 6/2020 | Johnson et al. | |
| 2004/0085205 A1 | 5/2004 | Yeh | |
| 2005/0068629 A1 * | 3/2005 | Fernando | B32B 17/10036 359/609 |
| 2006/0007005 A1 | 1/2006 | Yui et al. | |
| 2006/0010793 A1 * | 1/2006 | Martino | E06B 3/822 52/204.1 |
| 2006/0156361 A1 | 7/2006 | Wang et al. | |
| 2006/0164205 A1 | 7/2006 | Buckingham et al. | |
| 2008/0013303 A1 * | 1/2008 | Guarino | F21V 33/006 362/145 |
| 2009/0313790 A1 | 12/2009 | Schau | |
| 2010/0283579 A1 | 11/2010 | Kraus et al. | |
| 2012/0280783 A1 | 11/2012 | Gerhardt et al. | |
| 2013/0186001 A1 | 7/2013 | Cui et al. | |
| 2015/0027178 A1 | 1/2015 | Scalisi | |
| 2016/0049025 A1 | 2/2016 | Johnson | |
| 2016/0105650 A1 | 4/2016 | Carter | |
| 2016/0239001 A1 | 8/2016 | Chin et al. | |
| 2016/0275781 A1 * | 9/2016 | Nold | G08B 25/008 |
| 2016/0284181 A1 | 9/2016 | Johnson | |
| 2016/0319569 A1 | 11/2016 | Johnson et al. | |
| 2016/0319571 A1 | 11/2016 | Johnson | |
| 2017/0040827 A1 * | 2/2017 | Weber | H02J 50/10 |
| 2017/0193724 A1 | 7/2017 | Johnson et al. | |
| 2017/0228603 A1 | 8/2017 | Johnson | |
| 2017/0265124 A1 | 9/2017 | Seemann et al. | |
| 2017/0284129 A1 | 10/2017 | King | |
| 2018/0073274 A1 | 3/2018 | Johnson et al. | |
| 2018/0088431 A1 * | 3/2018 | Holt | G02F 1/157 |
| 2018/0135337 A1 | 5/2018 | Johnson et al. | |
| 2018/0179786 A1 | 6/2018 | Johnson | |
| 2018/0189117 A1 * | 7/2018 | Shrivastava | G06Q 50/10 |
| 2018/0268675 A1 | 9/2018 | Johnson et al. | |
| 2018/0283049 A1 | 10/2018 | Shiner et al. | |
| 2018/0364662 A1 * | 12/2018 | Meganathan | H04K 3/45 |
| 2019/0019364 A9 | 1/2019 | Cheng et al. | |
| 2019/0130686 A1 | 5/2019 | Cheng et al. | |
| 2019/0130687 A1 | 5/2019 | Johnson | |
| 2019/0130712 A1 | 5/2019 | Johnson et al. | |
| 2020/0236509 A1 | 7/2020 | Theurer et al. | |
| 2020/0250946 A1 | 8/2020 | Johnson et al. | |

OTHER PUBLICATIONS

International Search Report and Written Opinion, PCT/US2019/045010 (dated Dec. 23, 2019).

* cited by examiner

INTEGRATED ELECTRONIC ENTRY DOOR SYSTEMS

CROSS-REFERENCE TO RELATED PATENT APPLICATION

This application claims the benefit of U.S. Provisional Application No. 62/714,273, filed Aug. 3, 2018, which is incorporated herein by reference in its entirety.

BACKGROUND

Electronic entry door features, such as electronic door locks (e.g., push button, biometric sensor, RFID reader), intercoms, cameras, motion sensors, and lighting, have been provided as modular, battery powered solutions for installation on or near an entry door, to provide additional security and convenience, and may, for example, provide for remote communication with a user (e.g., homeowner, business owner, resident, or employee), for example, through wireless communication (e.g., Wi-Fi or cellular) with the user's cell phone, tablet or computer.

SUMMARY

One embodiment relates to a door assembly. The door assembly includes a door slab, an electronic component embedded in the door slab, and electric wiring connected to the electronic component. The door slab includes a frame defining a cavity, a core disposed within the cavity, a front door skin disposed along a front side of the frame, and a rear door skin disposed along a rear side of the frame. The front door skin and the rear door skin encloses the core within the cavity. The frame has a hinged edge configured to be pivotally coupled to a door jamb. The electric wiring is connected to the electronic component and routed through the door slab to the hinged edge to facilitate electrically coupling the electronic component to an external power source.

Another embodiment relates to a door assembly. The door assembly includes a door slab, a first electronic component embedded within the door slab, a second electronic component embedded within the door slab, and electric wiring connected to the first electronic component and the second electronic component. The electric wiring is configured to facilitate electrically coupling the first electronic component and the second electronic component to an external power source. The first electronic component includes at least one of an electronically-controllable privacy window or a camera device. The second electronic component includes an electronic locking mechanism.

Still another embodiment relates to a door assembly. The door assembly includes a doorjamb, a door slab, a hinge, a first electronic component, a second electronic component, and electric wiring. The door slab has a first side, an opposing second side, a first longitudinal edge, and an opposing second longitudinal edge. The hinge pivotally couples the first longitudinal edge of the door slab to the door jamb. The first electronic component is embedded within the door slab. The first electronic component includes at least one of an electronically-controllable privacy window or a camera device. The second electronic component is embedded within the door slab. The second electronic component includes an electronic locking mechanism. The electric wiring is connected to the first electronic component and the second electronic component. The electric wiring is configured to facilitate electrically coupling the first electronic component and the second electronic component to an external power source.

DETAILED DESCRIPTION

Before turning to the figures, which illustrate certain exemplary embodiments in detail, it should be understood that the present disclosure is not limited to the details or methodology set forth in the description or illustrated in the figures. It should also be understood that the terminology used herein is for the purpose of description only and should not be regarded as limiting.

Figure 8:
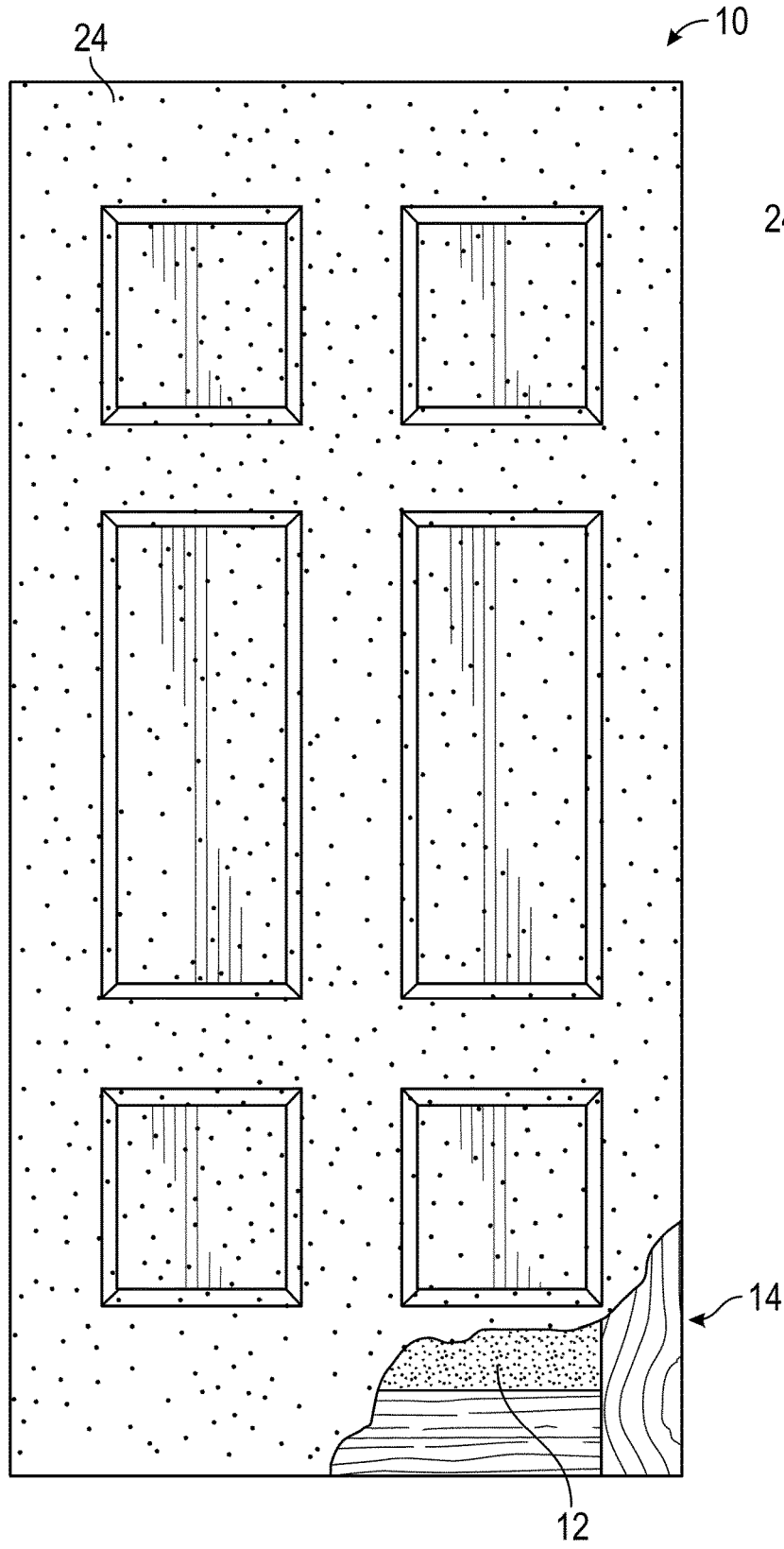
FIG. 8 is a front view of a composite door with a portion removed to expose the internal structure thereof, according to an exemplary embodiment.
Figure 9:
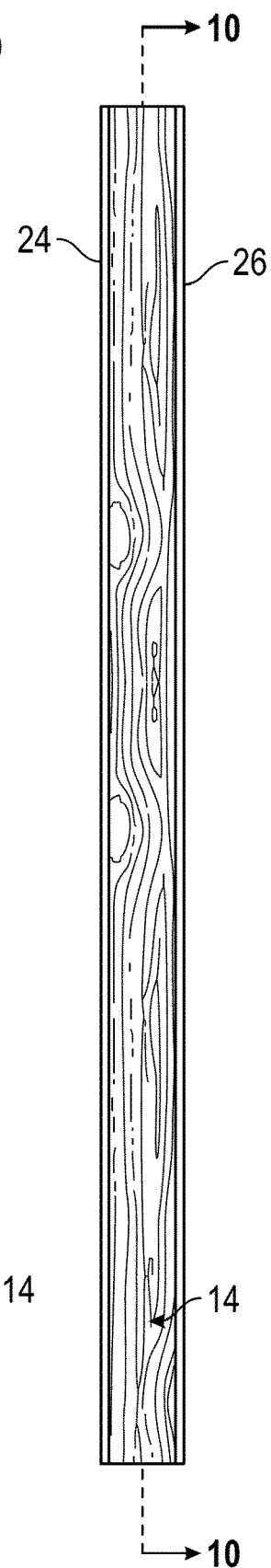
FIG. 9 is a side view of the door of FIG. 8.
Figure 10:
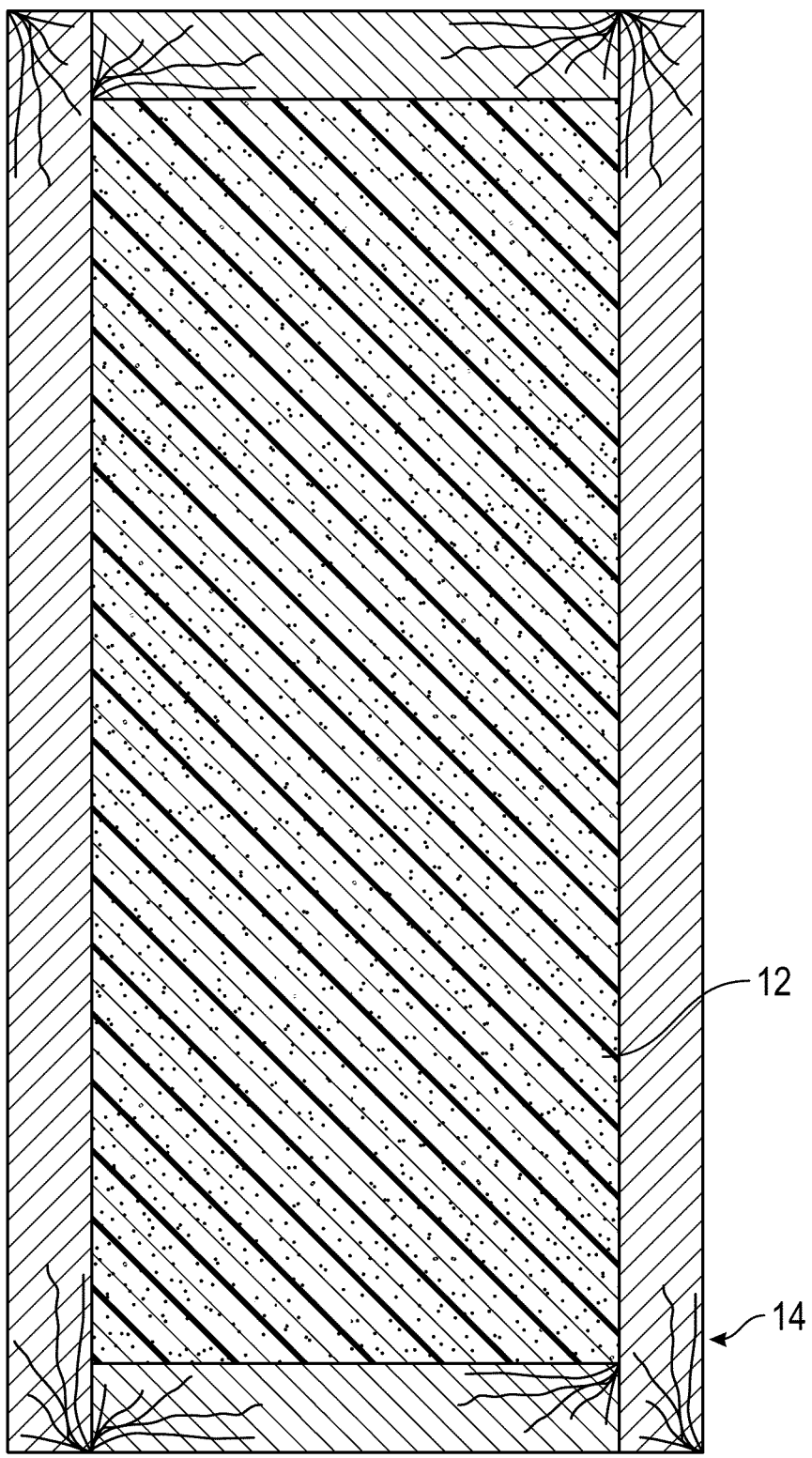
FIG. 10 is a cross-sectional view of the door of FIG. 9 showing the internal structure of thereof.

As shown in FIGS. 8-10, fiberglass doors 10 typically include a door-shaped solid (e.g., wooden) frame member 14, a polymeric foam-type core 12 positioned within the frame member 14, a first or front door skin 24 secured to a first side of the frame member 14, and a second or rear door skin 26 secured to a second side, opposite the first side, of the frame member 14. The front door skin 24 and the rear door skin 26 may, for example, be formed as fiberglass reinforced compression molded panels prepared from a molding compound.

According to an exemplary embodiment, a composite (e.g., having a fiberglass or foam filled frame) door assembly may be provided with one or more electronic features integrated into the door and in wired electrical communication with the building's electrical system to provide an integrated electronic (or "smart") entry door solution, without the need for separate end user installation of one or more modular electronic components.

While the electronic features and systems described herein may be integrated into many types of doors, the foam filled cavity of a composite fiberglass door facilitates incorporation of internal electronic features within the door, without requiring extensive machining or modification, as may be the case with a solid or monolithic door. Fiberglass doors typically include a door-shaped frame member (e.g., having wooden horizontal rails and vertical stiles), first and second fiberglass reinforced compression molded door skins secured to opposed first and second sides of the frame member, and a polymeric foam-type core (e.g., sprayed-in foam or cut block foam pieces) positioned between the door skins and within the frame member.

The door may include, within its foamed-in enclosure, electrical wiring for one or more electronic features, with the electrical wiring extending through a hinged portion (e.g., a hinged edge, etc.) of the door and into the door jamb for connection with the electrical system of the building. Exemplary electrical connections between the door edge and the door jamb, include, for example, electric transfer hinges (e.g., Series 1100 electric hinge, manufactured by ACSI) and flexible conduits (e.g., CDL series "concealed door loop," manufactured by Command Access Technologies).

Figure 1:
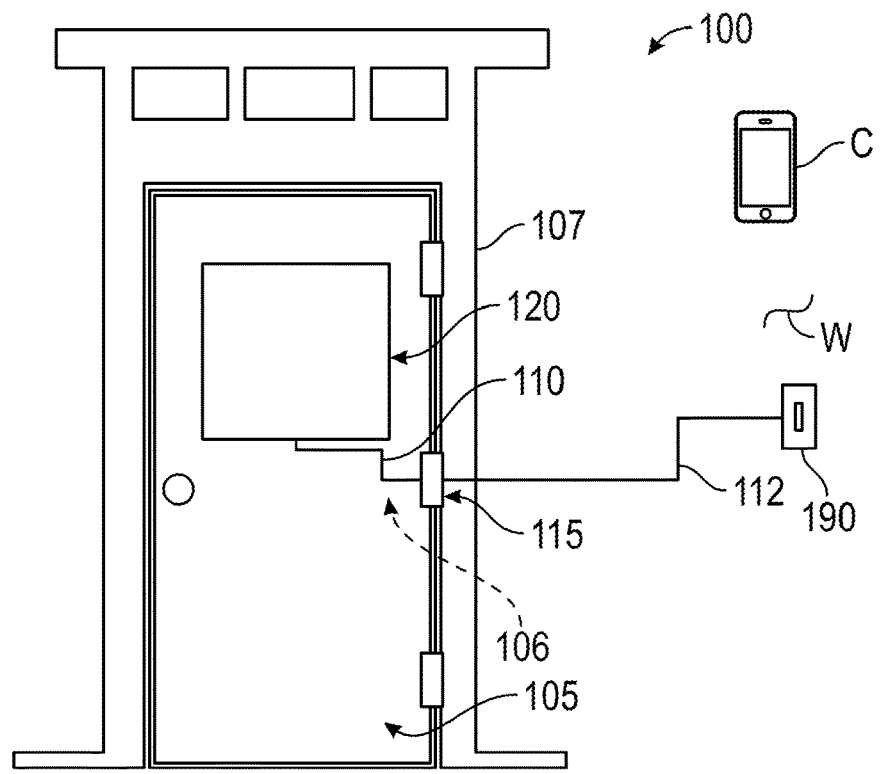
FIG. 1 is a schematic view of an integrated electronic door system with power supplied to the door slab through electrical wiring in the core, according to an exemplary embodiment.

In some embodiments, an electronic feature that is integral to the door, such as, for example, an electrically activated privacy window (as manufactured, for example, by Innovative Glass Corp) may be connected to a building electrical system by electrical wiring integrated into a composite door. As shown in FIG. 1, a door assembly, shown as door system 100, includes an electrically-operated window (e.g., a glass window, etc.), shown as privacy window 120, connected to electrical wiring 110 routed through an interior core (e.g., a foam core, etc.), shown as core 106, of a slab, shown as door slab 105, to a flexible conduit or electric transfer hinge 115 (as shown), and into a jamb, shown as door jamb 107. The electrical wiring 110 may be connected directly or indirectly by external wiring 112 with a switch, shown as control switch 190, installed, for example, on an interior building wall W, and connected with the building electrical system for user activation and deactivation of the privacy window 120. In other embodiments, the control switch 190 is additionally or alternatively disposed directly on a rear surface of the door. In still other embodiments, the control switch 190 is in wireless communication (e.g., RFID, Bluetooth®, infrared, Wi-Fi, etc.) with the privacy window 120 for wireless control of the privacy window 120, for example, through communication with a transceiver connected with the privacy window 120. In still other embodiments, a transceiver connected with the privacy window 120 is configured to communicate with a smart phone or other computing device C for remote user control of the privacy window 120 using, for example, a smart phone application.

The electrical wiring 110 may be installed in the door slab 105 after installation of the core 106, for example, into a slot or other such cutout in the core 106. In one embodiment, a channel for the electrical wiring 110 may be drilled into the core 106 of a completed door, allowing for post-production installation of an integrated electronic system. Alternatively, in other embodiments, the electrical wiring 110 may be installed in the door cavity prior to installation of the core 106. For example, the electrical wiring 110 may be secured (e.g., taped) against an interior surface of at least one of the door skins, and the core 106 may be subsequently installed (e.g., sprayed or inserted) over and/or around the electrical wiring 110.

Figure 2:
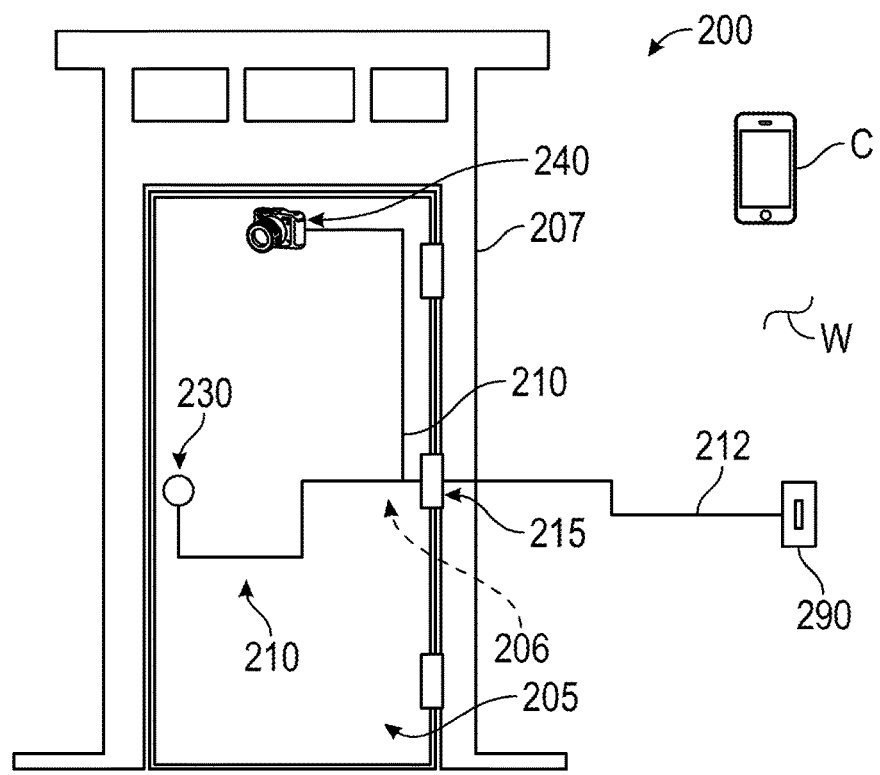
FIG. 2 is a schematic view of an integrated electronic door system with power supplied to the door slab through electrical wiring in the core, according to another exemplary embodiment.

In other embodiments, electronic features conventionally provided as mountable modular electronic components may be integrated into a door slab, with integrated electrical wiring connecting the electronic features to the building electrical system. As shown in FIG. 2, a door assembly, shown as door system 200, includes an electrically-operated locking mechanism (e.g., an electronic door latch, an electronic deadbolt, an electronic strike plate, etc.), shown as door lock 230, and security camera, shown as camera 240, connected to electrical wiring 210 routed through an interior core (e.g., a foam core, etc.), shown as core 206, of a slab, shown as door slab 205, (installed either before or after foam installation, as discussed above) to a flexible conduit or electric transfer hinge 215 (as shown), and into a jamb, shown as door jamb 207. The camera 240 may be fully enclosed within the door slab 205, with only a lens of the camera 240 exposed on a front surface of the door slab 205 (e.g., through an opening in the outer door skin). The camera may 240 be electrically connected with one or more sensors integrated into the door slab 205 (e.g., motion sensors, vibration sensors) to activate the camera 240 when activity at the door system 200 is detected.

To prevent contact between the electronic features and their electrical wiring connections with the core 206 (which may be flammable), the electronic features and their wiring connections may be fully enclosed in housing members embedded in either or both of the outer door frame (e.g., the frame member 14, etc.) and the core 206.

As shown in FIG. 2, the electrical wiring 210 may be connected directly or indirectly by external wiring 212 with a switch, shown as control switch 290, installed on an interior building wall W and connected with the building electrical system for user operation of the door lock 230 and the camera 240 (e.g., for specific control, for powering on/off, etc.). In other embodiments, the control switch 290 is additionally or alternatively disposed directly on a rear surface of the door slab 205. In still other embodiments, the control switch 290 is in wireless communication (e.g., RFID, Bluetooth®, infrared, Wi-Fi, etc.) with any of the electronic door features, for example, through communication with a transceiver connected with the corresponding electronic door feature. Additionally or alternatively, any one or more of the electronic door features may be provided with its own control system (e.g., an integrated controller, etc.) for remote user control of the electronic feature, for example, through wireless communication (e.g., Wi-Fi, cellular, Bluetooth, etc.) with a smart phone or other computing device C (e.g., a locally stored or web-based application). Either or both of the door lock 230 and the camera 240 may be provided with backup battery units, for example, for powered operation of the door lock 230 and/or the camera 240 in the event of loss of power to the building.

Figure 3:
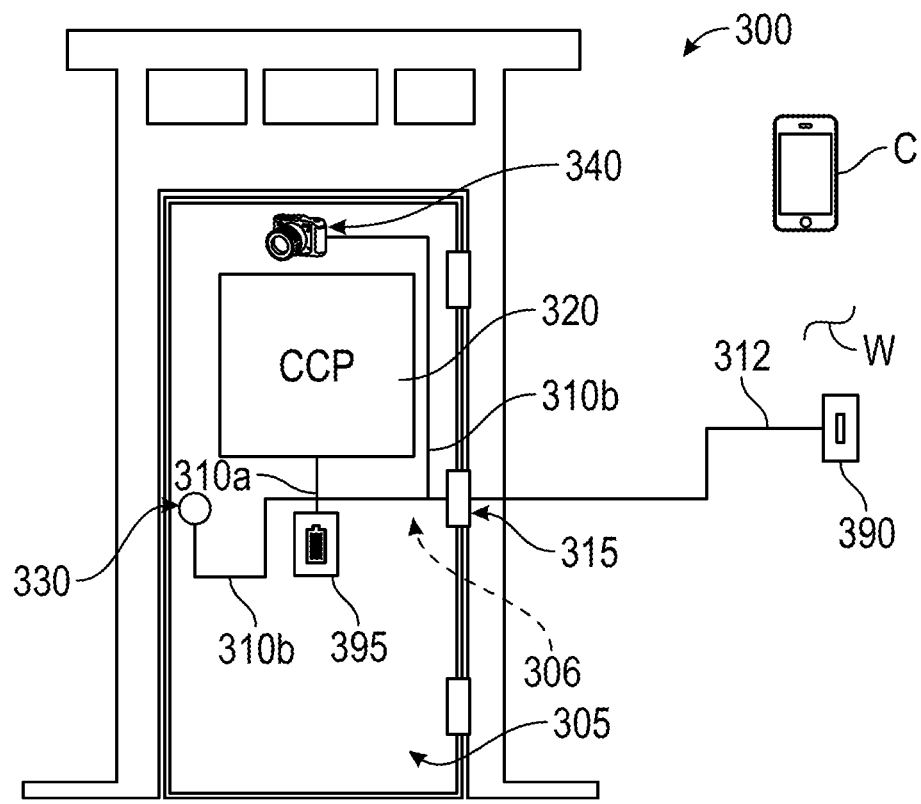
FIG. 3 is a schematic view of an integrated electronic door system with power supplied to the door slab through electrical wiring in the core, according to another exemplary embodiment.

In some integrated electronic door systems, electronic features may require different electrical power supplies (e.g., high voltage and low voltage power supplies). As shown in FIG. 3, a door assembly, shown as door system 300, includes (i) an electrically-operated window (e.g., a glass window, etc.), shown as privacy window 320, connected to first wiring, shown as high voltage electrical wiring 310a, and (ii) an electrically-operated locking mechanism, shown as door lock 330, and a security camera, shown as camera 340, connected to second, different wiring, shown as low voltage electrical wiring 310b. The high voltage electrical wiring 310a and the low voltage electrical wiring 310b are routed through an interior core (e.g., a foam core, etc.), shown as core 306, of a slab, shown as door slab 305, (installed either before or after foam installation, as discussed above) to a flexible conduit or electric transfer hinge 315 (as shown), and into a jamb, shown as door jamb 307, for connection with an external power source (e.g., a building power source, etc.). The high voltage electrical wiring 310*a* and the low voltage electrical wiring 310*b* may be connected directly or indirectly by external wiring 312 with a switch, shown as control switch 390, installed on an interior building wall W and connected with the building electrical system for user operation of one or more of the privacy window 320, the door lock 330, and the camera 340 (e.g., for specific control, for powering on/off, etc.). In other embodiments, the control switch 390 is disposed directly on a rear surface of the door slab 205. In still other embodiments, the control switch 390 is in wireless communication (e.g., RFID, Bluetooth®, infrared, Wi-Fi, etc.) with any of the electronic door features, for example, through communication with a transceiver connected with the corresponding electronic door feature.

Additionally or alternatively, any one or more of the electronic door features may be provided with its own control system (e.g., an integrated controller, etc.) for remote user control of the electronic feature, for example, through wireless communication (e.g., Wi-Fi, cellular, Bluetooth, etc.) with a smart phone or other computing device C (e.g., a locally stored or web-based application). Either or both of the door lock 330 and the camera 340 may be provided with backup battery units, for example, for powered operation of the door lock 330 and/or the camera 340 in the event of loss of power to the building. Additionally or alternatively, an internal power supply, shown as backup battery 395, may be integrated into the door slab 305 for connection with one or more of the electronic features of the door system 300 to supply backup power to the electronic features in the event of building power loss. In an exemplary embodiment, the backup battery 395 may be configured to supply only low voltage power to the corresponding low voltage electronic devices (e.g., the door lock 330, the camera 340, etc.) without powering high voltage electronic device(s) (e.g., the privacy window 320, etc.). The backup battery 395 may be a rechargeable battery connected with the building power supply and may be configured to recharge when power to the building is operational and/or restored.

Figure 4:
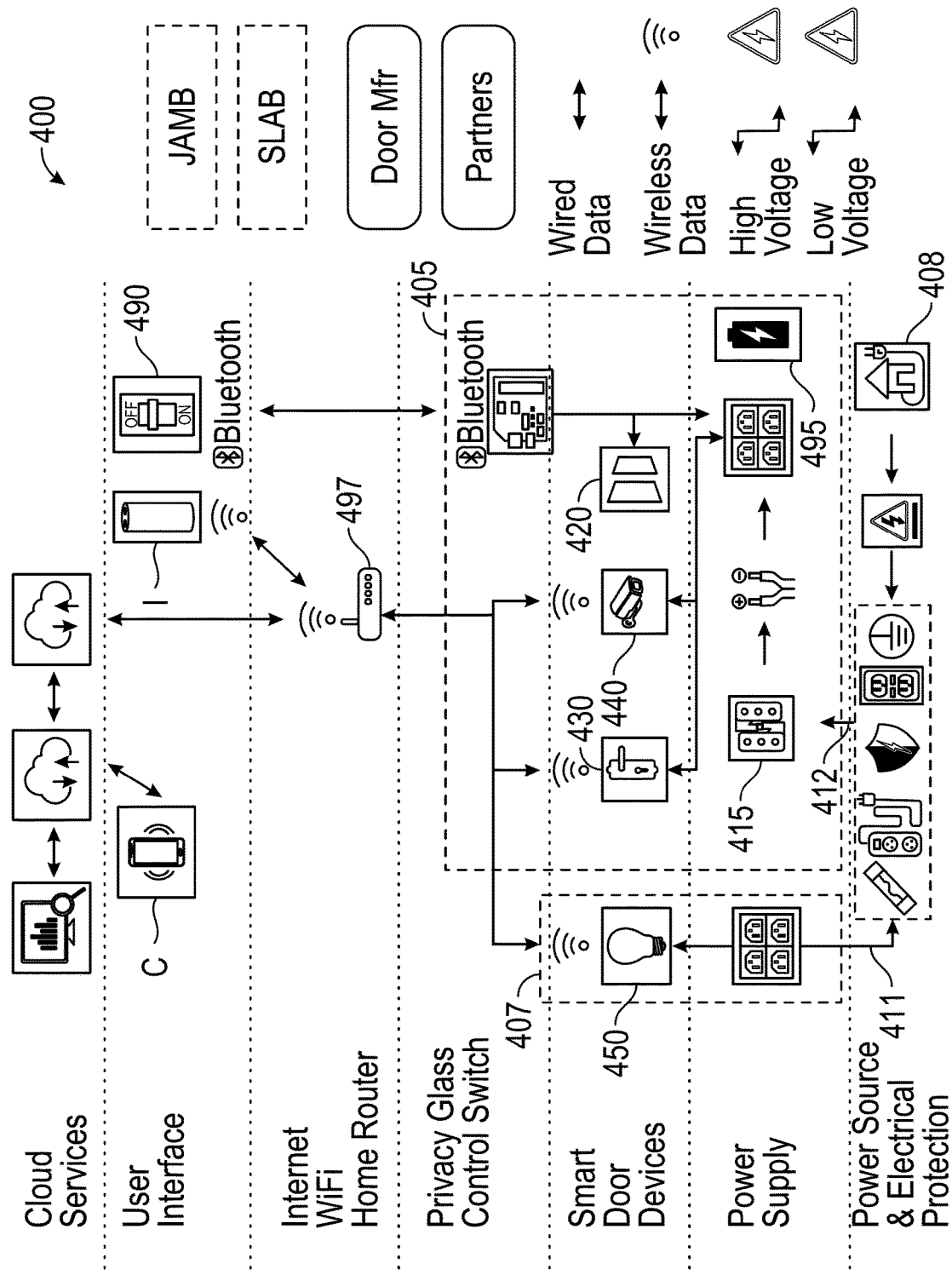
FIG. 4 is a schematic block diagram of an electronic control system for an integrated electronic control system having independently operable electronic features, according to an exemplary embodiment.

Referring now to FIG. 4, a schematic block diagram of an electronic control system, shown as control system 400, for an integrated electronic door (e.g., similar to the door system 300 of FIG. 3, etc.) is shown according to an exemplary embodiment. As shown in FIG. 4, the control system 400, a privacy window 420, a door lock 430, and a camera 440 are installed in a door slab 405 and connected by electrical wiring 412 through a flexible conduit or electric transfer hinge 415 to an external power source and/or to an optional internal power supply, shown as battery backup 495, positioned within the door slab 405. As shown in FIG. 4, a light source (e.g., a LED light strip, etc.), shown as lighting element 450, is installed in a jamb, shown as door jamb 407, (e.g., above the door slab 405, etc.) and is connected by electrical wiring 411 to an external power source, shown as building power source 408. The lighting element 450 and/or the camera 440 may be electrically connected with one or more sensors integrated into the door jamb 407 and/or the door slab 405 (e.g., motion sensors, vibration sensors, etc.) to activate the lighting element 450 and/or the camera 440 when activity at the door slab 405 is detected.

As shown in FIG. 4, the door lock 430, the camera 440, and the lighting element 450 are in wireless communication with a local Wi-Fi router, shown as router 497, for communication with a user interface I. As one example, the user interface I may be a voice controlled personal assistant (e.g., Amazon Echo® or the like) in wireless communication with the router 497, or a smartphone or other computing device C in communication with the router via cloud service communication (e.g., cloud service management by any one or more of the door manufacturer and/or the lock, camera, and/or lighting element provider). The privacy window 420 is in wireless communication (e.g., Bluetooth®, Wi-Fi, etc.) with a switch, shown as control switch 490, for local user control of the privacy window 420 and/or the lighting element 450.

Figure 5:
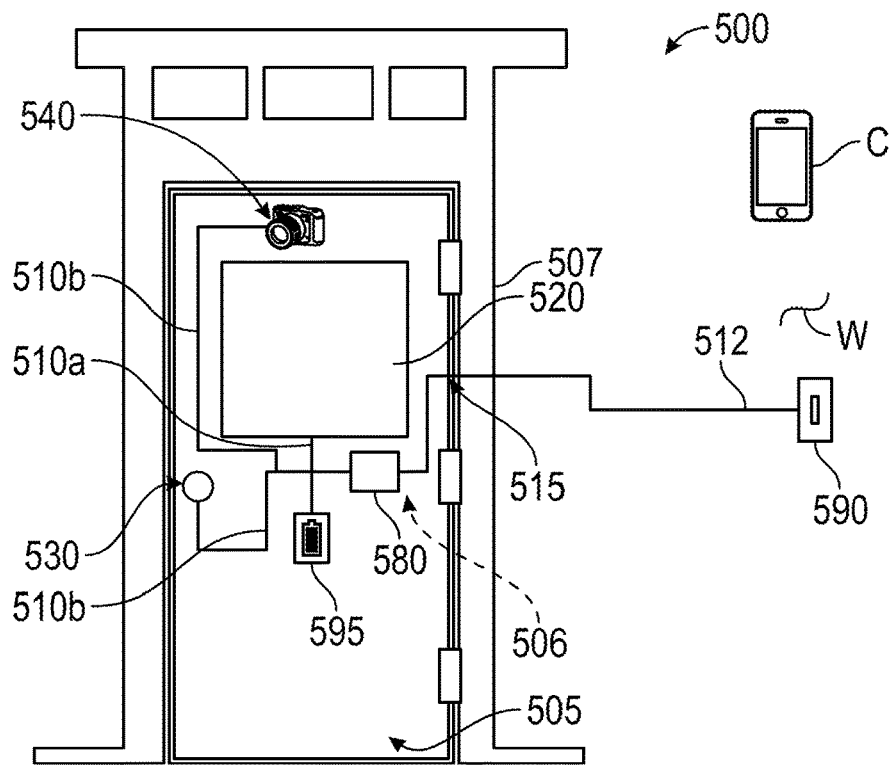
FIG. 5 is a schematic view of an integrated electronic door system with power supplied to the door slab through electrical wiring and a controller in the core, according to another exemplary embodiment.

In still other embodiments, an electronic door system may include an integrated controller (e.g., a control board, a control system, etc.) embedded in a composite door for integrated, single-source control of a plurality of electronic door features. As shown in FIG. 5, a door assembly, shown as door system 500, includes an electrically-operated window (e.g., a glass window, etc.), shown as privacy window 520, an electrically-operated locking mechanism, shown as door lock 530, and a security camera, shown as camera 540, connected by first wiring, shown as high voltage electrical wiring 510*a*, and second wiring, shown as low voltage electrical wiring 510*b* to a controller, shown as control board 580, respectively. The control board 580 is connected to (i) external wiring, shown as external electrical wiring 512, and (ii) the high voltage electrical wiring 510*a* and the low voltage electrical wiring 510*b* routed through an interior core (e.g., a foam core, etc.), shown as core 506, of the door slab 505 (installed either before or after foam installation, as discussed above) to an electric transfer hinge or flexible conduit 515 (as shown), and into a jamb, shown as door jamb 507, for connection with an external power source (e.g., a building power source, etc.). As shown in FIG. 5, the electrical wiring (e.g., the high voltage electrical wiring 510*a*, the low voltage electrical wiring 510*b*, the external electrical wiring 512, etc.) is connected (directly or indirectly) with a switch, shown as control switch 590, installed on an interior building wall W and connected with the building electrical system for user operation of one or more of the privacy window 520, the door lock 530, and the camera 540 (e.g., for specific control, for powering on/off, etc.). In other embodiments, the control switch 590 is additionally or alternatively disposed directly on a rear surface of the door slab 505. In still other embodiments, the control switch 590 is in wireless communication (e.g., RFID, Bluetooth®, infrared, Wi-Fi, etc.) with any of the electronic door features, for example, through communication with a transceiver connected with the corresponding electronic door feature.

The control board 580 may be provided with a wireless transceiver for wireless communication (e.g., Wi-Fi, cellular, Bluetooth, etc.) between any one or more of the installed electronic features and a smart phone or other computing device C (e.g., using a locally stored or web-based application). Additionally or alternatively, any one or more of the installed electronic features may be provided with their own control systems (e.g., an integrated controller, etc.) for remote user control of the electronic feature, for example, through wireless communication (e.g., Wi-Fi, cellular, Bluetooth, etc.) with a smart phone or other computing device C (e.g., using a locally stored or web-based application). Either or both of the door lock 530 and the camera 540 may be provided with backup battery units, for example, for powered operation of the door lock 530 and/or the camera 540 in the event of loss of power to the building. Additionally or alternatively, an internal power supply, shown as backup battery 595, may be integrated into the door slab 505 for connection with one or more of the electronic features of the door system 500 to supply backup power to the electronic features in the event of building power loss. In an exemplary embodiment, the backup battery 595 is configured to supply only low voltage power to the corresponding low voltage electronic devices (e.g., the door lock 530, the camera 540, etc.) without powering the high voltage electronic device(s) (e.g., the privacy window 520, etc.). The backup battery 595 may be a rechargeable battery connected with the building power supply and may be configured to recharge when power to the building is operational and/or restored.

Figure 6:
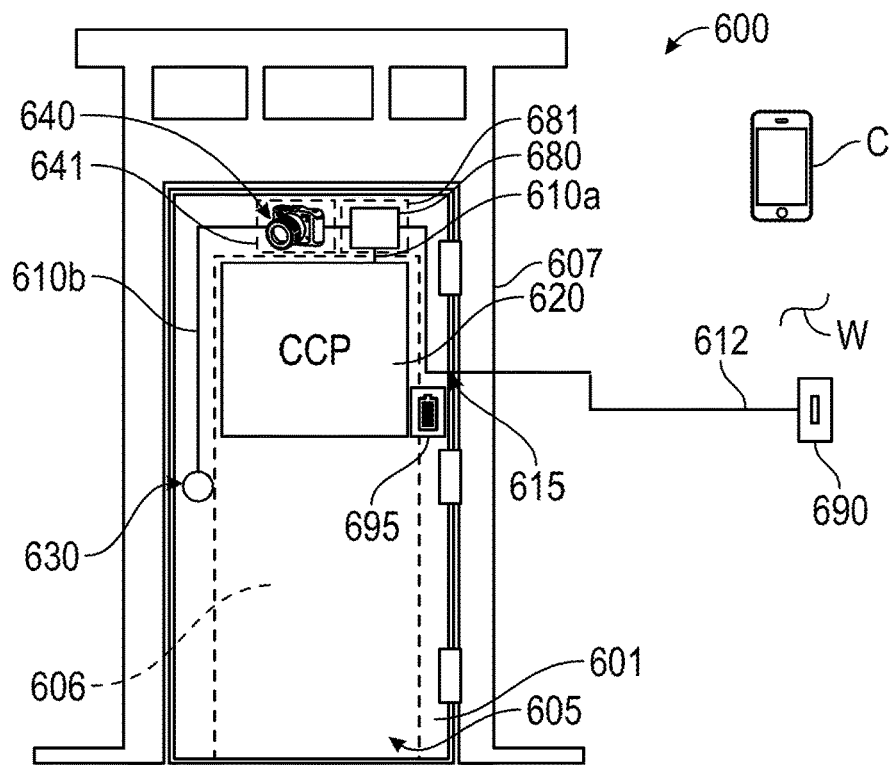
FIG. 6 is a schematic view of an integrated electronic door system with power supplied to the door slab through electrical wiring and a controller in the frame, according to another exemplary embodiment.

In other embodiments, a composite door may include electrical features and wiring embedded or otherwise disposed in an outer frame portion (e.g., the frame member 14, etc.) of the door such that a door may be assembled from a complete, electronics-integrated door frame member, for example, to reduce door assembly time. As shown in FIG. 6, a door assembly, shown as door system 600, includes an electrically-operated window (e.g., a glass window, etc.), shown as privacy window 620, an electrically-operated locking mechanism, shown as door lock 630, and a security camera, shown as camera 640, connected by first wiring, shown as high voltage electrical wiring 610a, and second wiring, shown as low voltage electrical wiring 610b, to a controller, shown as control board 680, respectively. The control board 680 is connected to (i) external wiring, shown as electrical wiring 612, and (ii) the high voltage electrical wiring 610a and the low voltage electrical wiring 610b routed through an interior core (e.g., a foam core, etc.), shown as core 606, of the door slab 605 (installed either before or after foam installation, as discussed above) to an electric transfer hinge or flexible conduit 615 (as shown), and into a jamb, shown as door jamb 607, for connection with an external power source (e.g., a building power source, etc.). The electrical wiring 610a, 610b, 612 is routed through channels in a door frame member (e.g., like the frame member 14; a through hole drilled or otherwise formed in the upper door rail, and the inner and outer door stiles; etc.), shown as frame 601. The camera 640 is retained in a first modular housing, shown as camera housing 641, received in a cavity in an upper edge of an upper door rail of the frame 601 with a lens of the camera 640 aligned with an aperture in the door slab 605 (e.g., an outer door skin thereof, etc.). The control board 680 is retained in a second modular housing, shown as a controller housing 681, received in the upper edge of the upper door rail of the frame 601. In other embodiments, the controller housing 681 is otherwise positioned within the frame 601 (e.g., received in the outer edge of one of the door stiles, etc.). The housing enclosures may protect the circuitry of the control board 680 and/or the camera 640, and their electrical wiring connections, from contact with the core 606 (e.g., which may be constructed from flammable material, etc.).

As shown in FIG. 6, the electrical wiring (e.g., the high voltage electrical wiring 510a, the low voltage electrical wiring 510b, the external electrical wiring 512, etc.) is connected (directly or indirectly) with a switch, shown as control switch 690, installed on an interior building wall W and connected with the building electrical system for user operation of one or more of the privacy window 620, the door lock 630, and the camera 640 (e.g., for specific control, for powering on/off, etc.). In other embodiments, the control switch 690 is additionally or alternatively disposed directly on a rear surface of the door slab 605. In still other embodiments, the control switch 690 is in wireless communication (e.g., RFID, Bluetooth®, infrared, Wi-Fi, etc.) with any of the electronic door features, for example, through communication with a transceiver connected with the corresponding electronic door feature.

The control board 680 may be provided with a wireless transceiver for wireless communication (e.g., Wi-Fi, cellular, Bluetooth, etc.) between any one or more of the installed electronic features and a smart phone or other computing device C (e.g., using a locally stored or web-based application). Additionally or alternatively, any one or more of the installed electronic features may be provided with their own control systems (e.g., an integrated controller, etc.) for remote user control of the electronic feature, for example, through wireless communication (e.g., Wi-Fi, cellular, Bluetooth, etc.) with a smart phone or other computing device C (e.g., using a locally stored or web-based application). Either or both of the door lock 630 and the camera 640 may be provided with backup battery units, for example, for powered operation of the door lock 630 and/or the camera 640 in the event of loss of power to the building. Additionally or alternatively, an internal power supply, shown as backup battery 695, may be integrated into the door slab 605 for connection with one or more of the electronic features of the door system 600 to supply backup power to the electronic features in the event of building power loss. In an exemplary embodiment, the backup battery 695 may be configured to supply only low voltage power to the corresponding low voltage electronic devices (e.g., the door lock 630, the camera 640, etc.) without powering the high voltage electronic device(s) (e.g., the privacy window 620). The backup battery 695 may be a rechargeable battery connected with the building power supply and may be configured to recharge when power to the building is operational and/or restored. Like the control board 680, the backup battery 695 may be enclosed in a third housing installed in the frame 601, for example, to facilitate installation, and/or to provide a fire safe enclosure for the backup battery 695 and its wiring connections.

Figure 7:
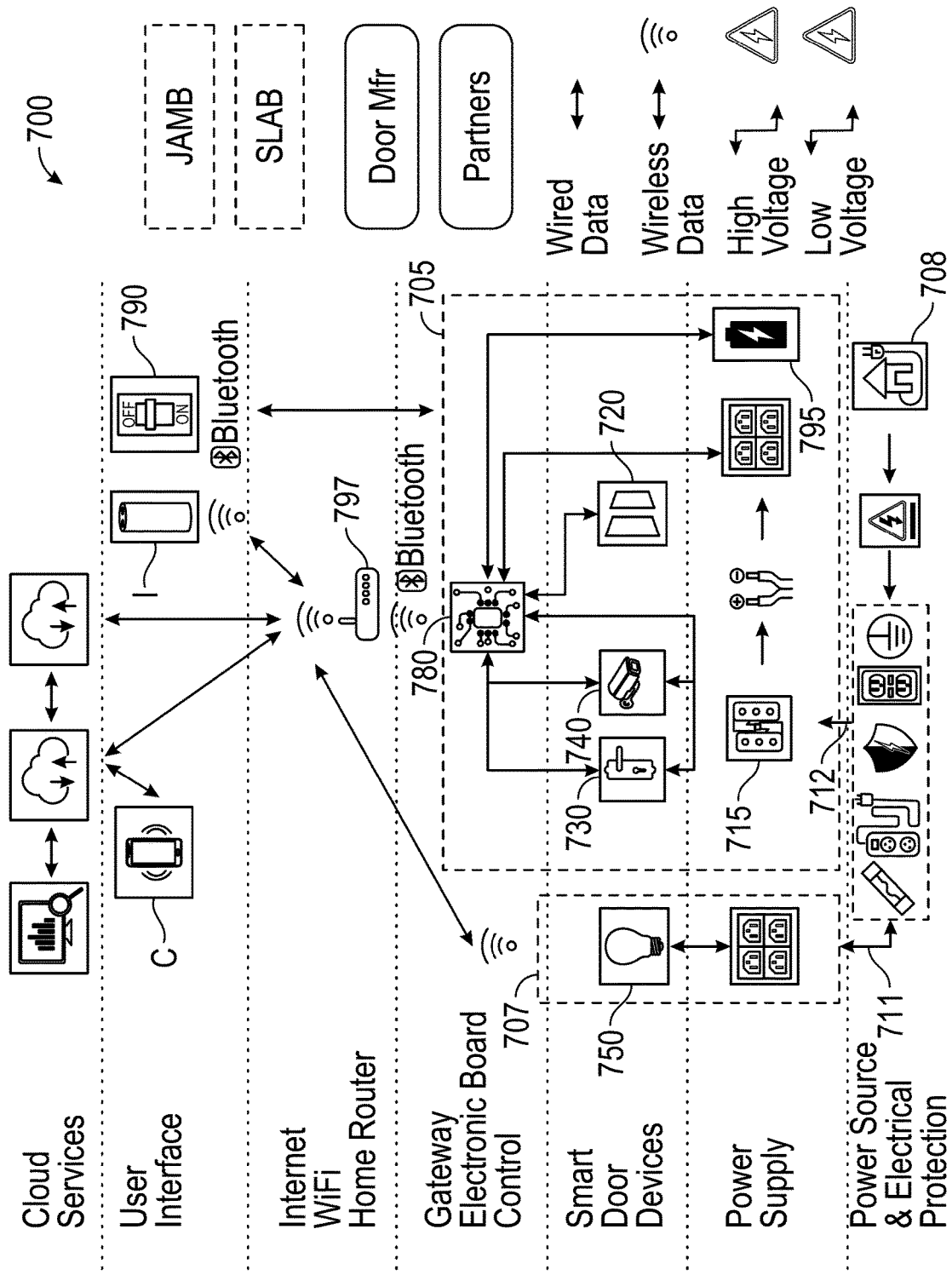
FIG. 7 is a schematic block diagram of an electronic control system for an integrated electronic control system having independently operable electronic features, according to an exemplary embodiment.

Referring now to FIG. 7, a schematic block diagram of an electronic control system, shown as control system 700, for an integrated electronic door (e.g., similar to the door system 600 of FIG. 6, etc.) is shown according to an exemplary embodiment. As shown in FIG. 7, the control system 700, a privacy window 720, a door lock 730, and a camera 740 are installed in a door slab 705 and connected by electrical wiring to a controller, shown as control board 780, which is connected by electric wiring 712 through an electric transfer hinge 715 to an external power source, and to an optional internal power supply, shown as backup battery 795, disposed within the door slab 705. As shown in FIG. 7, a light source (e.g., a LED light strip, etc.), shown as lighting element 750, is installed in a jamb, shown as door jamb 707, (e.g., above the door slab 705, etc.) and is connected by electrical wiring 711 to an external power source, shown as building power source 708.

The control board 780 is in wireless communication with a local Wi-Fi router, shown as router 797, for communication with a user interface I. As one example, the user interface I may be a voice controlled personal assistant (e.g., Amazon Echo® or the like) in wireless communication with the router 797, or a smartphone or other computing device C in communication with the router via cloud service communication (e.g., cloud service management by any one or more of the door manufacturer and/or the lock, camera, and/or lighting element provider). The privacy window 720 may be in wireless communication (e.g., Bluetooth®) with a wall mounted control switch 790 for local user control of the privacy window 720.

As utilized herein, the terms "approximately," "about," "substantially", and similar terms are intended to have a broad meaning in harmony with the common and accepted usage by those of ordinary skill in the art to which the subject matter of this disclosure pertains. It should be understood by those of skill in the art who review this disclosure that these terms are intended to allow a description of certain features described and claimed without restricting the scope of these features to the precise numerical ranges provided. Accordingly, these terms should be interpreted as indicating that insubstantial or inconsequential modifications or alterations of the subject matter described and claimed are considered to be within the scope of the disclosure as recited in the appended claims.

It should be noted that the term "exemplary" and variations thereof, as used herein to describe various embodiments, are intended to indicate that such embodiments are possible examples, representations, or illustrations of possible embodiments (and such terms are not intended to connote that such embodiments are necessarily extraordinary or superlative examples).

The term "coupled" and variations thereof, as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. If "coupled" or variations thereof are modified by an additional term (e.g., directly coupled), the generic definition of "coupled" provided above is modified by the plain language meaning of the additional term (e.g., "directly coupled" means the joining of two members without any separate intervening member), resulting in a narrower definition than the generic definition of "coupled" provided above. Such coupling may be mechanical, electrical, or fluidic.

References herein to the positions of elements (e.g., "top," "bottom," "above," "below") are merely used to describe the orientation of various elements in the FIGURES. It should be noted that the orientation of various elements may differ according to other exemplary embodiments, and that such variations are intended to be encompassed by the present disclosure.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device) may include one or more devices (e.g., RAM, ROM, Flash memory, hard disk storage) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit or the processor) the one or more processes described herein.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. Combinations of the above are also included within the scope of machine-readable media. Machine-executable instructions include, for example, instructions and data which cause a general purpose computer, special purpose computer, or special purpose processing machines to perform a certain function or group of functions.

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It is important to note that the construction and arrangement of the door systems and the components thereof as shown in the various exemplary embodiments is illustrative only. Additionally, any element disclosed in one embodiment may be incorporated or utilized with any other embodiment disclosed herein. Although only one example of an element from one embodiment that can be incorporated or utilized in another embodiment has been described above, it should be appreciated that other elements of the various embodiments may be incorporated or utilized with any of the other embodiments disclosed herein.

The invention claimed is:

1. A door assembly comprising:
   a door slab comprising:
      a frame having an upper rail, a lower rail, an inner stile, and an outer stile, the frame defining a cavity, the frame having a hinged edge configured to be pivotally coupled to a door jamb, the inner stile, the outer stile, and at least one of the upper rail or the lower rail cooperatively defining one or more channels therealong;
      a core disposed within the cavity;
      a front door skin disposed along a front side of the frame; and
      a rear door skin disposed along a rear side of the frame, the front door skin and the rear door skin enclosing the core within the cavity;
   an electronically-controllable privacy window disposed within the cavity of the frame of the door slab, the electronically-controllable privacy window having an adjustable opacity;
   an electronic locking mechanism coupled to the outer stile of the frame of the door slab; and
   electric wiring connected to the electronic locking mechanism and the electronically-controllable privacy window, the electric wiring routed along the one or more channels of the frame to the hinged edge of the frame to facilitate electrically coupling the electronic locking mechanism and the electronically-controllable privacy window to an external power source, the electric wiring including (i) first wiring extending along the one or more channels of the frame to the electronic locking mechanism to facilitate providing power to the electronic locking mechanism at a first voltage and (ii) second wiring extending along the one or more channels, into the cavity, and to the electronically-controllable privacy window to facilitate providing power to the electronically-controllable privacy window at a second voltage that is greater than the first voltage.

2. The door assembly of claim 1, further comprising two or more of a camera device, an internal power source, or a controller.

3. The door assembly of claim 1, further comprising an internal power source embedded in the door slab, wherein the internal power source is configured to (i) store electrical energy and (ii) provide power to the electronic locking mechanism and not to the electronically-controllable privacy window in response to power not being provided by the external power source.

4. The door assembly of claim 1, further comprising a camera device, the camera device having a lens that is exposed through the front door skin.

5. The door assembly of claim 4, further comprising a sensor, wherein the camera device is configured to activate in response to the sensor detecting activity proximate the door slab.

6. The door assembly of claim 1, further comprising a wireless transmitter configured to facilitate wireless communication with an external device.

7. The door assembly of claim 1, further comprising an input device coupled to at least one of the electronic locking mechanism or the electronically-controllable privacy glass via the electric wiring, wherein the input device is at least one of (i) coupled along the rear door skin or (ii) separate from the door slab.

8. The door assembly of claim 1, further comprising a controller embedded in the door slab, the controller coupled to the electronic locking mechanism and the electronically-controllable privacy glass.

9. The door assembly of claim 8, wherein the controller has a wireless transmitter configured to facilitate wireless communication with an external device.

10. The door assembly of claim 8, further comprising an input device coupled to the controller via the electric wiring, wherein the input device is at least one of (i) coupled along the rear door skin or (ii) separate from the door slab.

11. The door assembly of claim 1, further comprising a housing disposed within the door slab, the housing configured to receive an electronic component and isolate the electronic component from the core of the door slab.

12. The door assembly of claim 1, further comprising an electric transfer hinge coupled along the hinged edge of the frame, the electric transfer hinge configured to (i) pivotally couple the door slab to the door jamb and (ii) electrically couple the electric wiring to the external power source.

13. The door assembly of claim 1, further comprising:
   the door jamb; and
   a lighting element coupled to the door jamb and positioned to illuminate an area in front of the front door skin.

14. A door assembly comprising:
   a door slab including a frame having an upper rail, a lower rail, an inner stile, and an outer stile, wherein the frame defines a cavity, and wherein the inner stile, the outer stile, and at least one of the upper rail or the lower rail cooperatively define one or more channels;
   an electronically-controllable privacy window disposed within the cavity of the frame of the door slab, the electronically-controllable privacy window having an adjustable opacity;
   an electronic locking mechanism coupled to the outer stile of the frame of the door slab; and
   electric wiring including (i) low voltage wiring extending along the one or more channels of the frame to the electronic locking mechanism and (ii) high voltage wiring extending along the one or more channels, into the cavity, and to the electronically-controllable privacy window, the electric wiring configured to facilitate electrically coupling the electronically-controllable privacy window and the electronic locking mechanism to an external power source.

15. A door assembly comprising:
   a door jamb;
   a door slab having a first side, an opposing second side, a first longitudinal edge, and an opposing second longitudinal edge, the door slab including a frame having an upper rail, a lower rail, an inner stile, and an outer stile, wherein the frame defines a cavity, and wherein the inner stile, the outer stile, and at least one of the upper rail or the lower rail cooperatively define one or more channels;
   a hinge pivotally coupling the first longitudinal edge of the door slab to the door jamb;
   a first electronic component embedded within the cavity of the frame of the door slab, the first electronic component including an electronically-controllable privacy window having an adjustable opacity;
   a second electronic component embedded within the outer stile of the frame of the door slab, the second electronic component including an electronic locking mechanism; and electric wiring including (i) first wiring extending along the one or more channels of the frame to the electronic locking mechanism to facilitate providing power to the electronic locking mechanism at a first voltage and (ii) second wiring extending along the one or more channels, into the cavity, and to the electronically-controllable privacy window to facilitate providing power to the electronically-controllable privacy window at a second voltage that is greater than the first voltage, the electric wiring configured to facilitate electrically coupling the first electronic component and the second electronic component to an external power source.

* * * * *